(12) United States Patent
Numata

(10) Patent No.: US 11,767,442 B2
(45) Date of Patent: Sep. 26, 2023

(54) NANOCARBON INK AND METHOD FOR MANUFACTURING SEMICONDUCTOR DEVICE IN WHICH SAME IS USED

(71) Applicant: NEC Corporation, Tokyo (JP)

(72) Inventor: Hideaki Numata, Tokyo (JP)

(73) Assignee: NEC CORPORATION, Tokyo (JP)

( * ) Notice: Subject to any disclaimer, the term of this patent is extended or adjusted under 35 U.S.C. 154(b) by 601 days.

(21) Appl. No.: 16/648,493

(22) PCT Filed: Sep. 28, 2018

(86) PCT No.: PCT/JP2018/036592
§ 371 (c)(1),
(2) Date: Mar. 18, 2020

(87) PCT Pub. No.: WO2019/066074
PCT Pub. Date: Apr. 4, 2019

(65) Prior Publication Data
US 2020/0216688 A1 Jul. 9, 2020

(30) Foreign Application Priority Data
Sep. 29, 2017 (WO) .................. PCT/JP2017/035526

(51) Int. Cl.
| | | |
|---|---|---|
| *C09D 11/38* | (2014.01) | |
| *C01B 32/159* | (2017.01) | |
| *C09D 11/52* | (2014.01) | |
| *H10K 85/20* | (2023.01) | |
| *C01B 32/174* | (2017.01) | |
| *C09D 11/324* | (2014.01) | |
| *B82Y 10/00* | (2011.01) | |

(52) U.S. Cl.
CPC ............ *C09D 11/38* (2013.01); *C01B 32/159* (2017.08); *C01B 32/174* (2017.08); *C09D 11/324* (2013.01); *C09D 11/52* (2013.01); *H10K 85/221* (2023.02); *B82Y 10/00* (2013.01); *C01B 2202/02* (2013.01)

(58) Field of Classification Search
None
See application file for complete search history.

(56) References Cited

U.S. PATENT DOCUMENTS

| | | | | |
|---|---|---|---|---|
| 2011/0215315 A1* | 9/2011 | Toguchi | ............ | H01L 21/02527 257/E51.04 |
| 2017/0029634 A1* | 2/2017 | Hao | ...................... | C01B 32/174 |

FOREIGN PATENT DOCUMENTS

| | | |
|---|---|---|
| JP | 2010/150808 A1 | 12/2010 |
| JP | 2011-168417 A | 9/2011 |
| JP | 4834950 B2 | 12/2011 |
| WO | 2010/053171 A1 | 5/2010 |
| WO | 2018/159001 A1 | 9/2018 |

OTHER PUBLICATIONS

International Search Report for PCT/JP2018/036592 dated Dec. 18, 2018 [PCT/ISA/210].
Written Opinion for PCT/JP2018/036592 dated Dec. 18, 2018 {PCT/ISA/237].

* cited by examiner

*Primary Examiner* — Katie L. Hammer
(74) *Attorney, Agent, or Firm* — Sughrue Mion, PLLC

(57) ABSTRACT

A nanocarbon ink contains nanocarbons, a solvent, and a polyoxyethylene alkyl ether represented by the following expression: $C_nH_{2n}(OCH_2CH_2)_mOH$ where, n=12 to 18 and m=20 to 100.

12 Claims, 18 Drawing Sheets

NANOCARBON INK AND METHOD FOR MANUFACTURING SEMICONDUCTOR DEVICE IN WHICH SAME IS USED

CROSS REFERENCE TO RELATED APPLICATIONS

This application is a National Stage of International Application No. PCT/JP2018/036592 filed Sep. 28, 2018, claiming priority based on International Application No. PCT/JP2017/035526 filed Sep. 29, 2017.

TECHNICAL FIELD

The present invention relates to a nanocarbon ink and a method for manufacturing a semiconductor device in which the same is used. Particularly, the present invention relates to a single-walled carbon nanotube ink and a method for manufacturing a semiconductor device in which the same is used.

BACKGROUND ART

Semiconductor devices in which carbon nanotubes are used for a channel layer have been studied. In order to form a channel layer for a thin film transistor (TFT) using a carbon nanotube, carbon nanotube dispersion liquids constituted of the carbon nanotube dispersed in a solvent have been used.

Patent Document 1 describes a technique for forming a channel layer composed of a carbon nanotube between a source electrode and a drain electrode using a dispersion liquid constituted of a carbon nanotube dispersed in ethanol or dimethylformamide which is a solvent.

PRIOR ART DOCUMENTS

Patent Documents

[Patent Document 1] Japanese Patent No. 4834950

SUMMARY OF THE INVENTION

Problem to be Solved by the Invention

However, the technique described in Patent Document 1 has a problem in which it is difficult to adjust a density of a single-walled carbon nanotube forming the channel layer to an appropriate range.

The present invention was made in view of the above circumstances and an object of the present invention is to provide a nanocarbon ink in which a channel layer composed of nanocarbons having a density of nanocarbons in an appropriate range can be formed when the channel layer is formed in a case in which a TFT is prepared using a printing method and a method for manufacturing a semiconductor device in which the same is used.

Means for Solving the Problem

A nanocarbon ink according to an example aspect of the present invention contains nanocarbons, a solvent, and a polyoxyethylene alkyl ether represented by the following Expression (1):

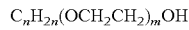

$$C_nH_{2n}(OCH_2CH_2)_mOH \qquad (1)$$

(where, n=12 to 18 and m=20 to 100).

Effect of the Invention

According to the present invention, it is possible to provide a nanocarbon ink in which a channel layer composed of nanocarbons having a density of nanocarbons in an appropriate range can be formed when the channel layer is formed in a case in which a TFT is prepared using a printing method and a method for manufacturing a semiconductor device in which the same is used.

EMBODIMENTS FOR CARRYING OUT THE INVENTION

Figure 1:
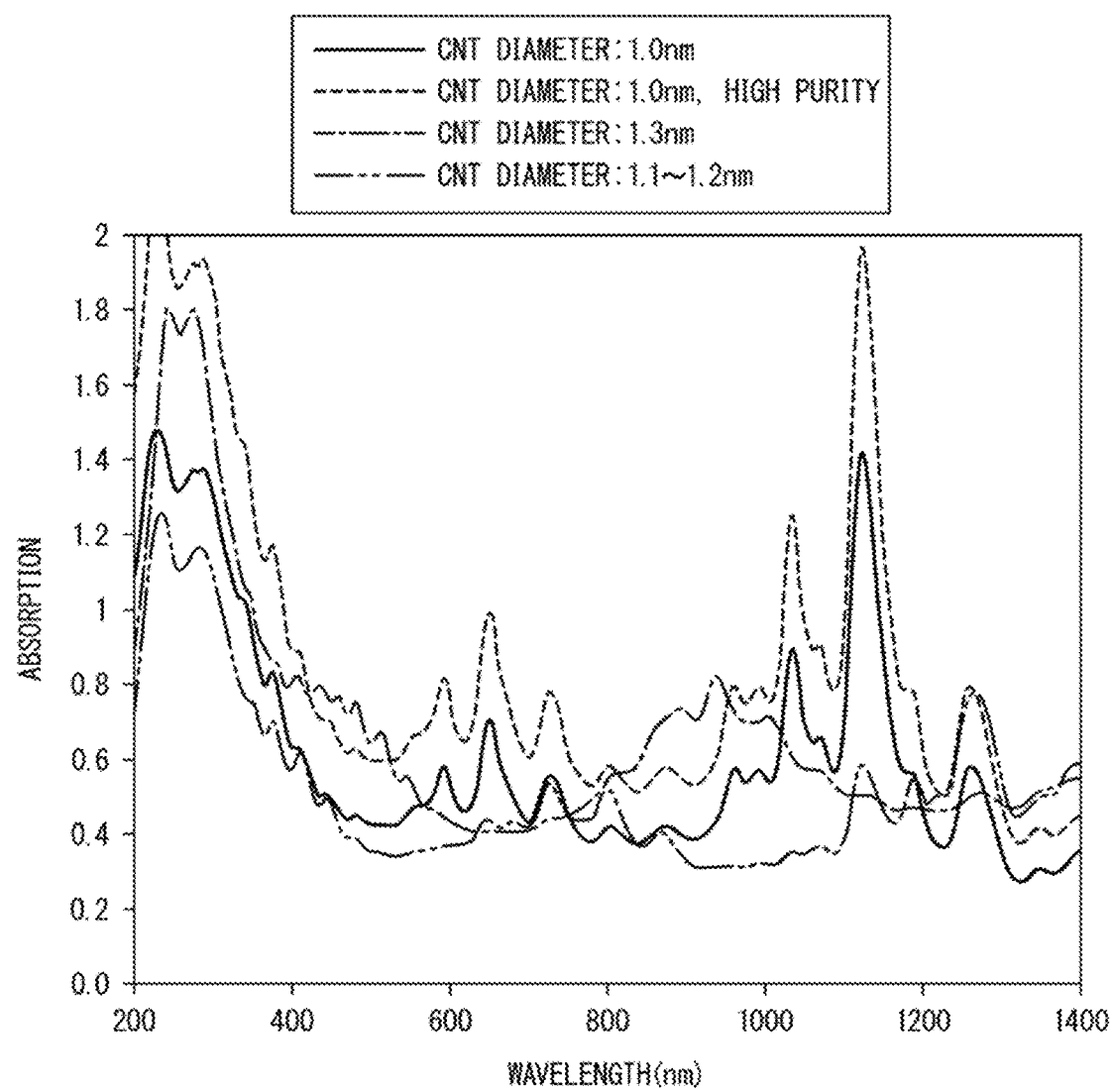
FIG. 1 is a diagram showing an absorption spectrum of a single-walled carbon nanotube at a wavelength of 200 nm to 1400 nm.

Embodiments of a nanocarbon ink according to the present invention and a method for manufacturing a semiconductor device in which the nanocarbon ink is used will be described.

These embodiments are specifically described to make the gist of the invention better understood and is not intended to limit the present invention unless otherwise stated.

[Nanocarbon Ink]

A nanocarbon ink of this embodiment contains nanocarbons, a solvent, and a polyoxyethylene alkyl ether represented by the following Expression (1):

$$C_nH_{2n}(OCH_2CH_2)_mOH \quad (1)$$

(where, n=12 to 18 and m=20 to 100).

The nanocarbons contained in the nanocarbon ink in this embodiment refer to a carbon material mainly composed of carbon such as single-walled carbon nanotubes, double-walled carbon nanotubes, multi-walled carbon nanotubes, carbon nanohoms, carbon nanotwists, graphene, and fullerenes. In the nanocarbon ink in this embodiment, a case in which, particularly a single-walled carbon nanotube is used for a nanocarbon will be described in detail.

It is known that single-walled carbon nanotubes are divided into single-walled carbon nanotubes having two different properties, i.e., metallic single-walled carbon nanotubes and semiconducting single-walled carbon nanotubes in accordance with diameters of tubes and a winding method. In a general method for synthesizing a single-walled carbon nanotube, single-walled carbon nanotube mixtures containing metallic single-walled carbon nanotubes having metallic properties and semiconducting single-walled carbon nanotubes having semiconductive properties in a statistical ratio of 1:2 are obtained.

The single-walled carbon nanotube mixtures are not particularly limited as long as the single-walled carbon nanotube mixtures contain a metallic single-walled carbon nanotube and a semiconducting single-walled carbon nanotube. Furthermore, the single-walled carbon nanotubes contained in the nanocarbon ink in this embodiment may be single-walled carbon nanotubes alone and may be a single-walled carbon nanotubes in which carbon is partially substituted with an arbitrary functional group or single-walled carbon nanotubes modified with an arbitrary functional group. In addition, also when a semiconducting single-walled carbon nanotube is extracted from a single-walled carbon nanotube mixture using the method described in PCT International Publication No. WO 2010/150808 and a semiconducting single-walled carbon nanotube having high purity is to be used, this semiconducting single-walled carbon nanotube is effective.

A dispersion medium is not particularly limited as long as the dispersion medium can disperse a single-walled carbon nanotube mixture. Examples of the solvent include water, heavy water, organic solvents, ionic solutions, and the like. Among these solvents, it is desirable that any of water, heavy water, and a mixture of water and heavy water be used because then the quality of a single-walled carbon nanotube does not deteriorate.

Hereinafter, the nanocarbon ink in this embodiment is referred to as a single-walled carbon nanotube ink.

In the single-walled carbon nanotube ink in this embodiment, a polyoxyethylene alkyl ether represented by the foregoing Expression (1) is a dispersant for dispersing a single-walled carbon nanotube.

Examples of the polyoxyethylene alkyl ether represented by the foregoing Expression (1) include polyoxyethylene (23) lauryl ether (trade name: Brij L23; manufactured by Sigma-Aldrich), polyoxyethylene (20) cetyl ether (trade name: Brij C20; manufactured by Sigma-Aldrich), polyoxyethylene (20) stearyl ether (trade name: Brij S20; polyoxyethylene (20) oleyl ether (trade name: Brij O20; manufactured by Sigma-Aldrich), polyoxyethylene (100) stearyl ether (trade name: Brij S100; manufactured by Sigma-Aldrich), and the like.

The amount of the polyoxyethylene alkyl ether in the single-walled carbon nanotube ink in this embodiment is preferably 0.03 wt % or more and 0.50 wt % or less, and more preferably 0.03 wt % or more and 0.25 wt % or less.

If the amount of the polyoxyethylene alkyl ether is 0.03 wt % or more, when a channel layer in a semiconductor device has been formed using the single-walled carbon nanotube ink, a semiconductor device having an excellent on/off ratio is obtained. On the other hand, if the amount of the polyoxyethylene alkyl ether is 0.50 wt % or less, a semiconductor device having sufficient practical characteristics can be obtained. Furthermore, if the amount of the polyoxyethylene alkyl ether is 0.25 wt % or less, a semiconductor device having small variation in characteristics is obtained.

The amount of the single-walled carbon nanotube in the single-walled carbon nanotube ink in this embodiment is defined by an absorbance at a wavelength of 310 nm when an optical path length is 10 mm.

In the single-walled carbon nanotube ink in this embodiment, the absorbance at a wavelength of 310 nm when the optical path length is 10 mm is preferably 0.2 or more, and more preferably 0.6 or more and 2.2 or less.

If the absorbance at a wavelength of 310 nm when the optical path length is 10 mm is within the above range, when a channel layer for a thin film transistor (TFT) has been formed using the single-walled carbon nanotube ink through printing, a semiconductor device having excellent transistor characteristics is obtained. Furthermore, if the absorbance at a wavelength of 310 nm when the optical path length is 10 mm is 0.6 or more, when the channel layer in the semiconductor device has been formed using the single-walled carbon nanotube ink, a semiconductor device having mobility higher than those of a general coating type organic semiconductor and amorphous silicon is obtained. On the other hand, the absorbance at a wavelength of 310 nm when the optical path length is 10 mm is 2.2 or less, when the channel layer in the semiconductor device has been formed using the single-walled carbon nanotube ink, a semiconductor device having an on/off ratio of over 10,000 is obtained.

Here, in the single-walled carbon nanotube ink in this embodiment, the reason why attention is paid to the absorbance at a wavelength of 310 nm when the optical path length is 10 mm will be described.

FIG. 1 is a diagram showing an absorption spectrum of a single-walled carbon nanotube at a wavelength of 200 nm to 1400 nm.

As shown in FIG. 1, an absorbance of the single-walled carbon nanotube at a wavelength of 400 nm to 1400 nm is highly dependent on a diameter the single-walled carbon nanotube and is discrete. For this reason, when single-walled carbon nanotubes having different diameters are contained, it is difficult to define a concentration of the single-walled carbon nanotubes.

Therefore, in the single-walled carbon nanotube ink in this embodiment, as shown in FIG. 1, the concentration of single-walled carbon nanotubes is defined by paying attention to the absorbance at a wavelength of 310 nm which has a low dependence on the diameter of the single-walled carbon nanotubes. Thus, the concentration of single-walled carbon nanotubes in the single-walled carbon nanotube ink is accurately defined. As a result, when the channel layer is formed using a printing method, a single-walled carbon nanotube ink in which a channel layer having a density of single-walled carbon nanotubes in an appropriate range can be formed is obtained.

A method for preparing the single-walled carbon nanotube ink in this embodiment is not particularly limited as long as a known method is used as the method. Examples of the method include a method for subjecting a single-walled carbon nanotube and a dispersion medium containing a polyoxyethylene alkyl ether to ultrasonic treatment to disperse the single-walled carbon nanotube. This ultrasonic treatment sufficiently separates aggregated single-walled carbon nanotubes and the single-walled carbon nanotube ink is obtained by uniformly dispersing the single-walled carbon nanotube in the dispersion medium. It is desirable that single-walled carbon nanotubes which have not been dispersed through ultrasonic treatment be separated and removed through ultracentrifugation.

Also, for example, also when a semiconducting single-walled carbon nanotube is extracted from a single-walled carbon nanotube mixture using the method described in PCT International Publication No. WO 2010/150808 and a semiconducting single-walled carbon nanotube having high purity is used, this semiconducting single-walled carbon nanotube is effective.

According to the single-walled carbon nanotube ink in this embodiment, when the channel layer composed of the single-walled carbon nanotube is formed using the printing method, it is possible to form a channel layer having a density of single-walled carbon nanotubes in an appropriate range.

[Method for Manufacturing Semiconductor Device]

A method for manufacturing a semiconductor device in this embodiment is a method for manufacturing a semiconductor device in which the single-walled carbon nanotube ink in this embodiment is used and includes a step of adhering the single-walled carbon nanotube ink to a channel layer forming region between a source electrode and a drain electrode to form a channel layer.

A method for manufacturing a semiconductor device in this embodiment will be described below with reference to FIGS. 2 to 8.

Figure 2:
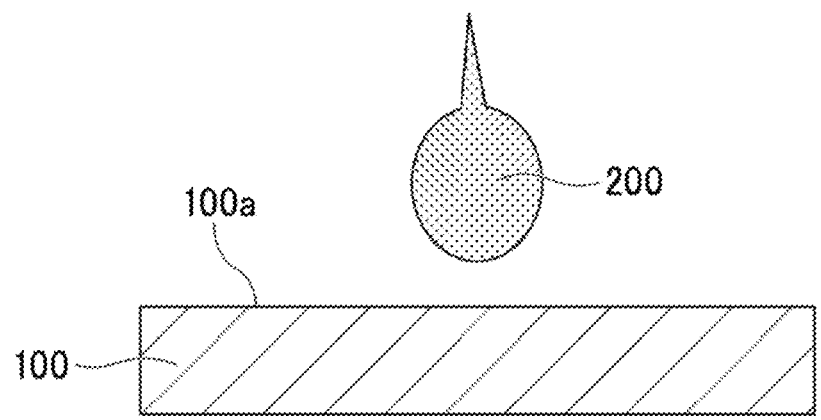
FIG. 2 is a schematic diagram showing a method for manufacturing a semiconductor device according to an embodiment.

As shown in FIG. 2, a gate electrode 110 (refer to FIG. 3) is formed by printing a nano silver paste 200 on one main surface 100a in a plastic film 100 and sintering. Examples of a coating method of the nano silver paste 200 include an ink jet method.

Figure 3:
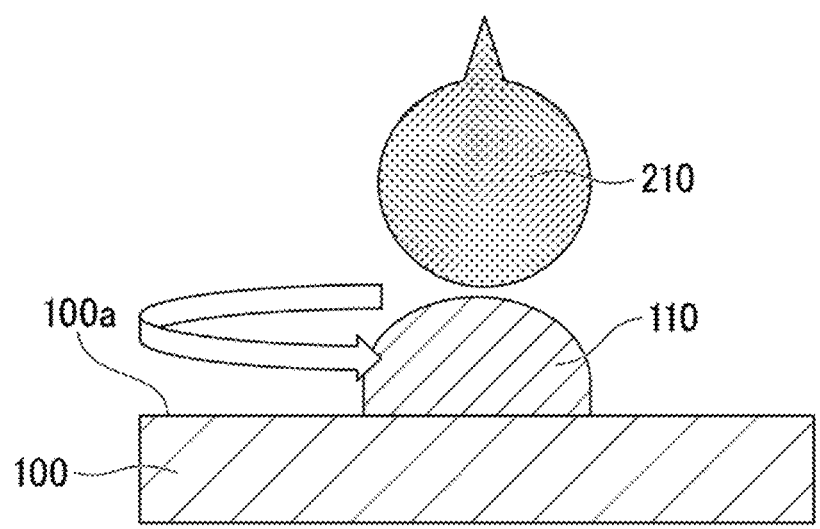
FIG. 3 is a schematic diagram showing the method for manufacturing the semiconductor device according to the embodiment.

Subsequently, as shown in FIG. 3, an insulating film 120 (refer to FIG. 4) is formed by applying a resin 210 so that the resin 210 covers the gate electrode 110 formed on the one main surface 100a of the plastic film 100 and thermally curing the resin 210. Examples of a coating method of the resin 210 include a spin coating method.

Figure 4:
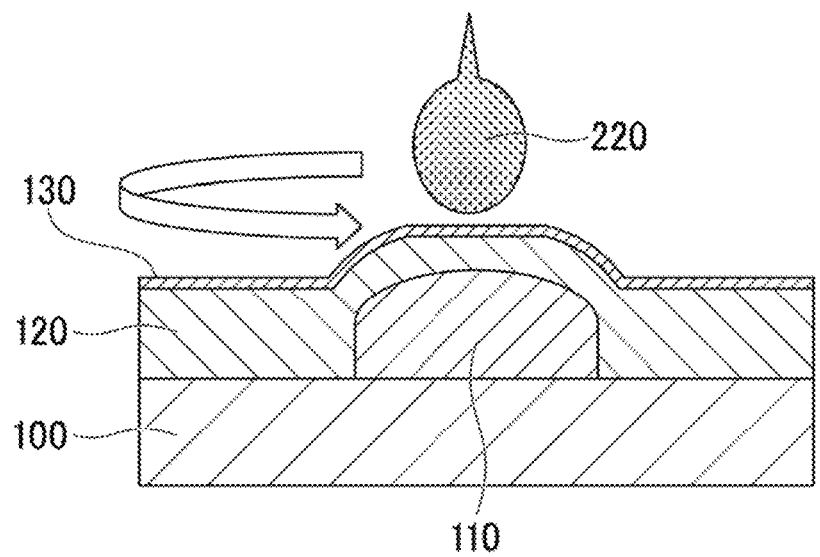
FIG. 4 is a schematic diagram showing the method for manufacturing the semiconductor device according to the embodiment.

Subsequently, as shown in FIG. 4, a thin silica film 130 is formed by applying a silsesquioxane 220 so that the silsesquioxane 220 covers the insulating film 120 and sintering the silsesquioxane 220. Examples of a coating method of the silsesquioxane 220 include a spin coating method.

Figure 5:
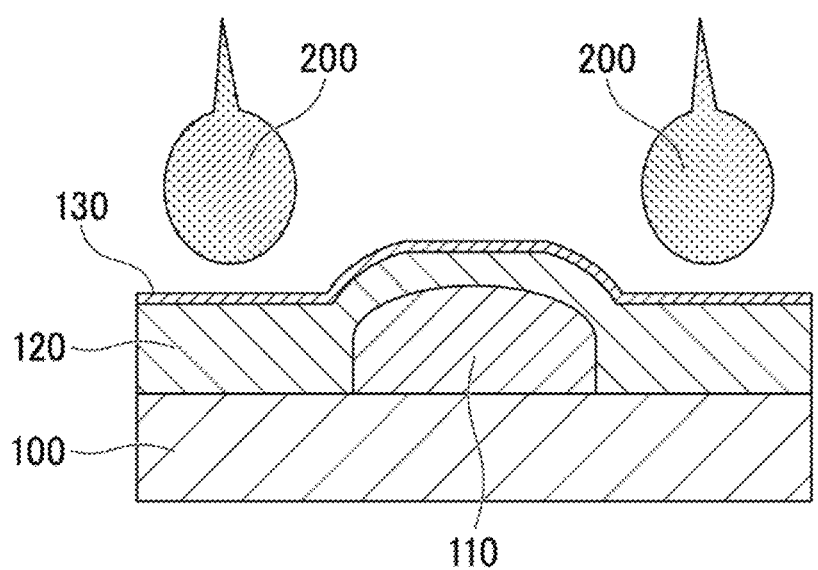
FIG. 5 is a schematic diagram showing the method for manufacturing the semiconductor device according to the embodiment.

Subsequently, as shown in FIG. 5, a source electrode 140 and a drain electrode 150 (refer to FIG. 6) are formed by printing the nano silver paste 200 at a position in the silica film 130 corresponding to the gate electrode 110 and sintering the nano silver paste 200. Examples of a coating method of the nano silver paste 200 include an ink jet method.

Figure 6:
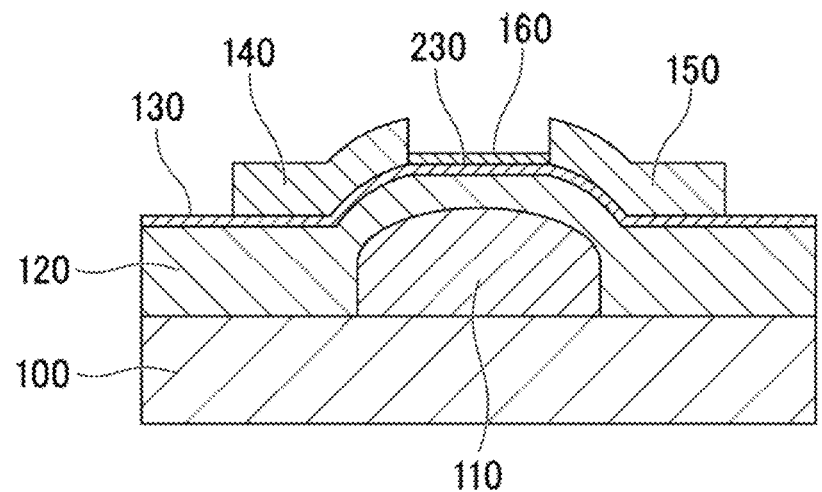
FIG. 6 is a schematic diagram showing the method for manufacturing the semiconductor device according to the embodiment.

Subsequently, as shown in FIG. 6, a coating film 230 made of 3-aminopropyltriethoxysilane is formed by coating a channel layer forming region 160 between the source electrode 140 and the drain electrode 150 with 3-aminopropyltriethoxysilane. Examples of a coating method of 3-aminopropyltriethoxysilane include a dip coating method.

Figure 7:
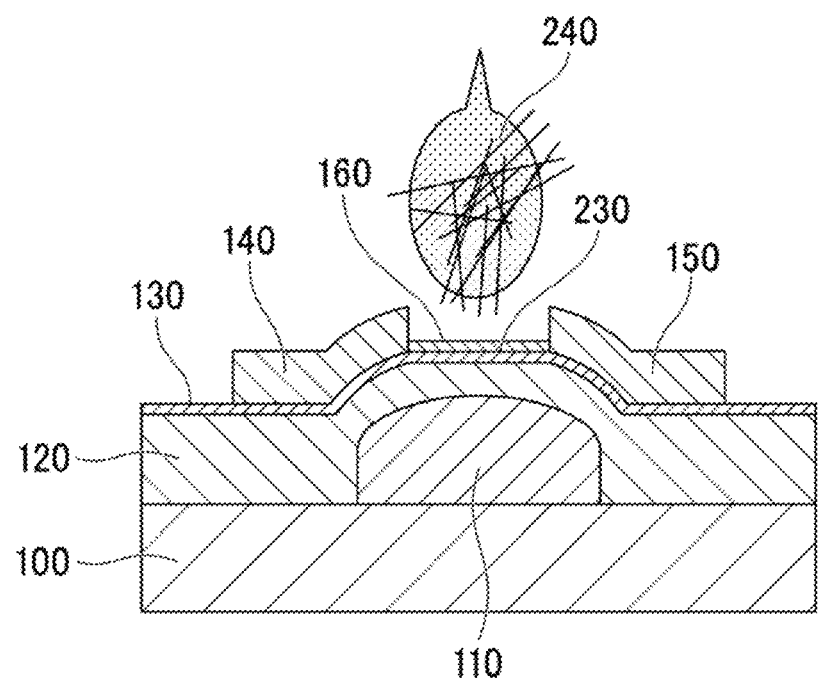
FIG. 7 is a schematic diagram showing the method for manufacturing the semiconductor device according to the embodiment.

Subsequently, as shown in FIG. 7, a single-walled carbon nanotube ink 240 is added dropwise to the channel layer forming region 160 on which the coating film 230 has been formed. Examples of a method for adding the single-walled carbon nanotube ink 240 dropwise include using a dispenser.

Figure 8:
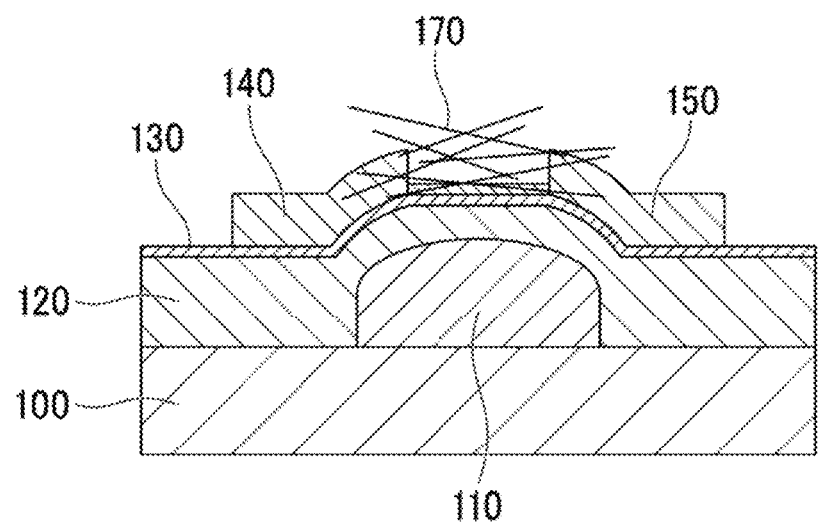
FIG. 8 is a schematic diagram showing the method for manufacturing the semiconductor device according to the embodiment.

Subsequently, as shown in FIG. 8, a channel layer 170 formed of a single-walled carbon nanotube is formed on the channel layer forming region 160 between the source electrode 140 and the drain electrode 150 by drying the single-walled carbon nanotube ink 240.

According to the method for manufacturing the semiconductor device in this embodiment, since the single-walled carbon nanotube ink in this embodiment is used, it is possible to form a channel layer having a density of single-walled carbon nanotubes in an appropriate range.

WORKING EXAMPLES

Although the present invention will be described in more detail below using Experimental Examples and Working Examples, the present invention is not limited to the following working examples.

Experimental Example 1

"Preparation of Single-Walled Carbon Nanotube Ink"

Solution A obtained by dissolving Brij S100 in heavy water was prepared. A single-walled carbon nanotube mixture (enhanced direct injection pyrolytic synthesis: improved direction injection thermal decomposition synthesis (eDIPS) single-walled carbon nanotube; an average diameter: 1.0 nm) was added to the solution A. The solution A having the single-walled carbon nanotube mixture added thereto was subjected to an ultrasonic dispersion treatment at an output of 30 W for 20 minutes using a horn type ultrasonic crusher (trade name: Digital Sonifier 450; manufactured by Branson Ultrasonics). After that, an ultracentrifugation operation was performed using an ultracentrifuge (trade name: CS100GX; manufactured by Hitachi koki) at revolutions per minute of 250000×g and 10° C. for 1 hour. Furthermore, a supernatant corresponding to 80% of the single-walled carbon nanotube mixture was obtained as a dispersion liquid of the single-walled carbon nanotube mixture.

Subsequently, for example, a semiconducting single-walled carbon nanotube was extracted from the dispersion liquid of the above-described single-walled carbon nanotube mixture using the method described in PCT International Publication No. WO 2010/150808 and a semiconducting single-walled carbon nanotube having high purity was obtained.

From the analysis of an optical absorption spectrum of a semiconductor carbon nanotube dispersion liquid; a Raman spectrum of a radial breathing mode (RBM) region, the purity of the semiconducting single-walled carbon nanotube was estimated to be 95% or more.

A plurality of single-walled carbon nanotube inks was prepared by adjusting a concentration of the single-walled carbon nanotube of the semiconducting single-walled carbon nanotube dispersion liquid and a concentration of Brij S100. In each of the semiconducting single-walled carbon nanotube inks, an absorbance at a wavelength of 310 nm when an optical path length was 10 mm was 0.6 or more and 1.1 or less and the amount of Brij S100 was 0.01 wt % or more and 0.25 wt % or less.

In the single-walled carbon nanotube ink in this experimental example, Brij S100 is used as a dispersant configured to disperse the single-walled carbon nanotube. A critical micelle concentration (CMC) of Brij S100 is about 0.01 wt %. In addition, in order to stably disperse the single-walled carbon nanotube, it is necessary to include 0.01 wt % or more of Brij S100. Furthermore, the higher the concentration of Brij S100, the more stable the dispersion liquid of the single-walled carbon nanotube, but Brij S100 is an insulator. Therefore, when a semiconductor device material and a single-walled carbon nanotube ink for a TFT or the like which are the object of the present invention are used, Brij S100 is likely to have a significant influence on electrical characteristics.

In these experimental examples, in an ink having a concentration of single-walled carbon nanotubes in which an absorbance at a wavelength of 310 nm when an optical path length is 10 mm is 0.6 or more and 1.1 or less, the aim is to investigate the influence of the concentration of the included Brij S100 on the electrical characteristics of the prepared TFT.

"Manufacturing of Printed TFT"

A gate electrode was formed by printing a nano silver paste (trade name: NPS-J; manufactured by Harima Chemicals Group, Inc.) on one main surface of a plastic film and sintering the nano silver paste using an ink jet method.

Subsequently, an insulating film was formed by coating the gate electrode with a polyimide resin and thermally curing the polyimide resin so that the polyimide resin covered the gate electrode formed on the one main surface of the plastic film using a spin coating method.

Subsequently, a thin silica film was formed by coating the insulating film with a silsesquioxane so that the silsesquioxane covered the insulating film using a spin coating method.

Subsequently, a source electrode and a drain electrode were formed by printing a nano silver paste (trade name: NPS-J; manufactured by Harima Chemicals Group, Inc.) at a position in the silica film corresponding to the gate electrode using an ink jet method and sintering the nano silver paste.

Subsequently, a coating film made of 3-aminopropyltriethoxysilane was formed by coating a channel layer forming region between the source electrode and the drain electrode with 3-aminopropyltriethoxysilane using a dip coating method.

Subsequently, the above-described single-walled carbon nanotube ink was added dropwise to the channel layer forming region on which the coating film was formed using a dispenser and then was dried. Furthermore, a printed carbon nanotube TFT was obtained by removing a surfactant remaining on the plastic film and forming a channel layer formed of the single-walled carbon nanotube on the channel layer forming region between the source electrode and the drain electrode.

Also, a plurality of TFTs were prepared in each of the single-walled carbon nanotube inks using the plurality of single-walled carbon nanotube inks prepared in the step of preparing the single-walled carbon nanotube ink.

"Evaluation of TFT Characteristics"

Transfer characteristics of the obtained TFTs were measured. For the measurement, a semiconductor parameter analyzer 4156C (manufactured by Agilent) was used. A drain voltage was set to −2 V and a gate voltage (Vg) was swept from −40 V to +40 V.

Figure 9:
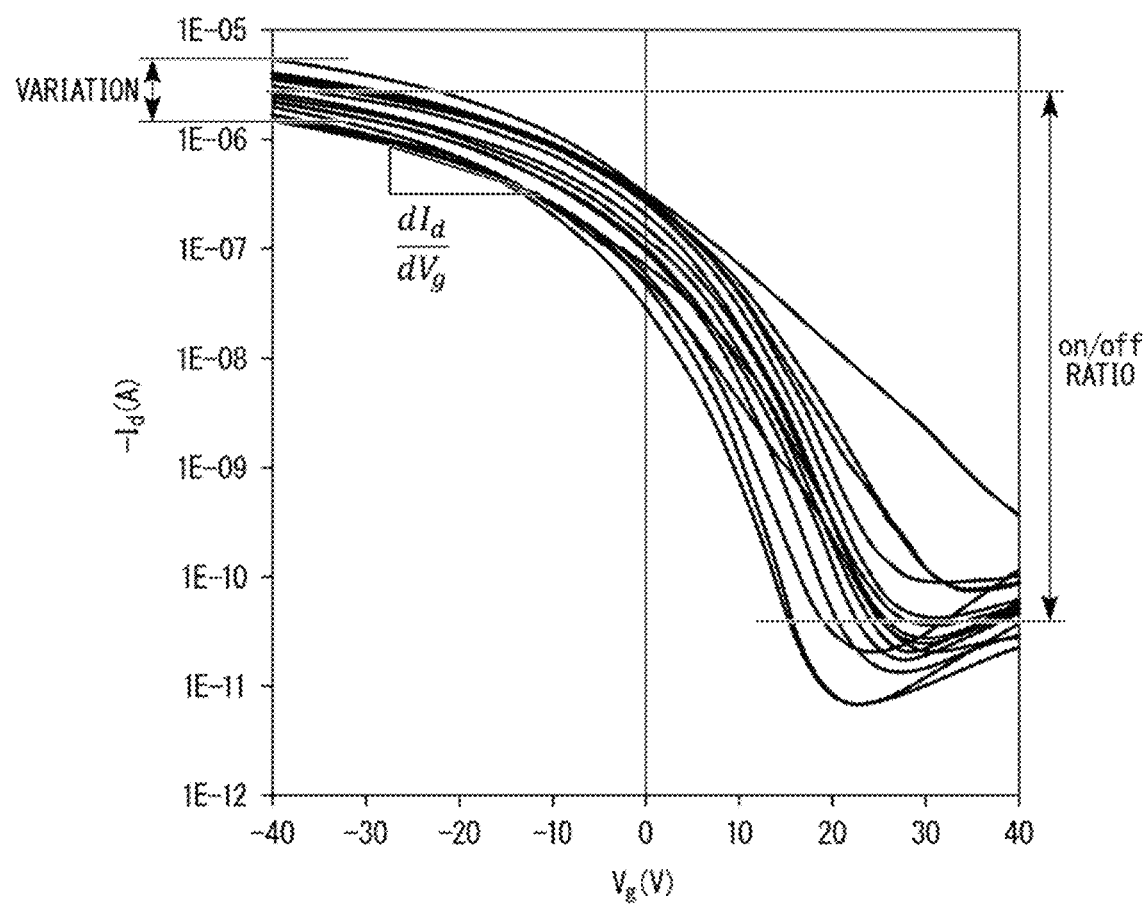
FIG. 9 is a diagram showing transfer characteristics of a thin film transistor (TFT) in Experimental Example 1.

An example of the transfer characteristics obtained by measuring the plurality of prepared TFTs is shown in FIG. 9. An obtained maximum (negative) drain current (Id) was defined as an on current, i.e., Ion, an obtained minimum (negative) drain current was defined as an off current, i.e., Ioff, and Ion/Ioff was defined as an on/off ratio. Furthermore, a mutual conductance ($dI_d/dV_g$) was obtained from the obtained transfer characteristics and field effect mobility was calculated using a parallel plate model. In addition, a standard deviation σ of Ion was calculated from the evaluation results of a plurality of (about 30) TFTs and σ/Ion was calculated as a relative variation value. The smaller the relative variation value, the better the uniformity.

Figure 10:
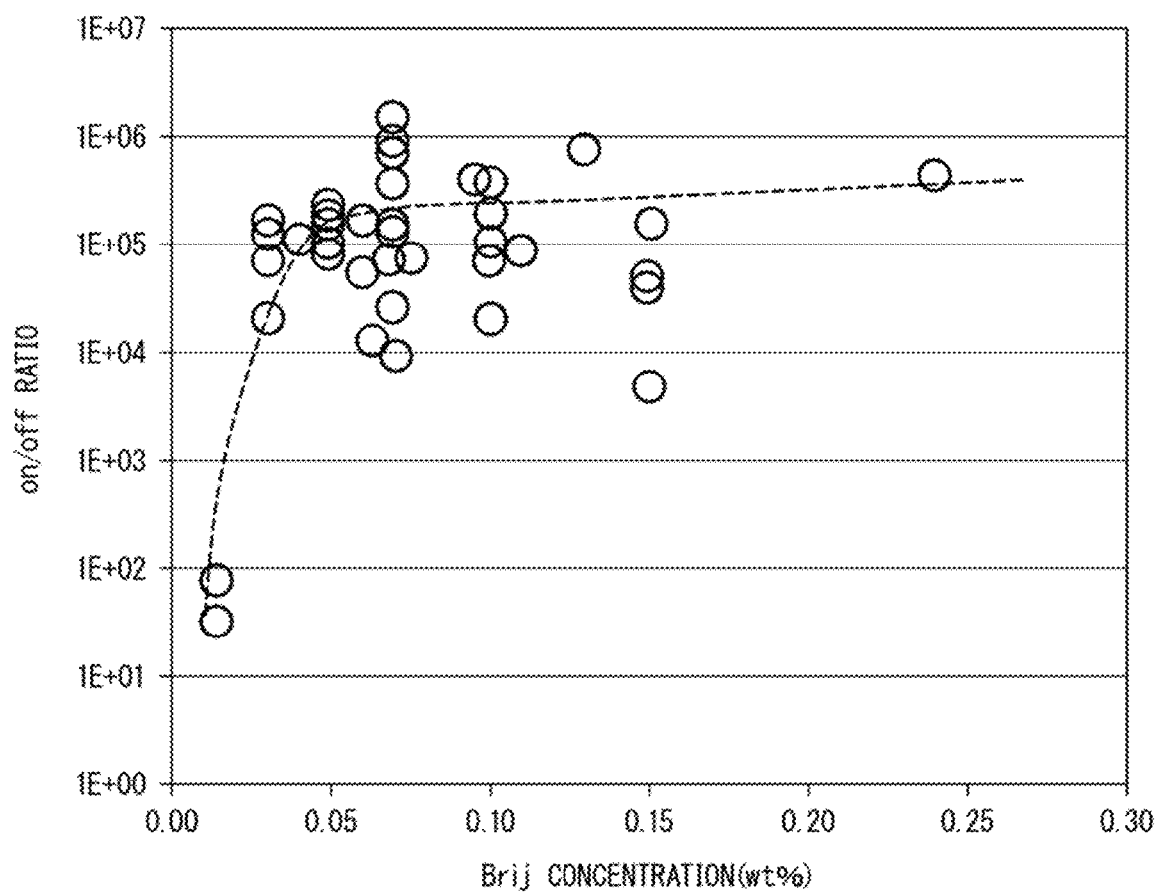
FIG. 10 is a diagram showing a relationship between the amount of Brij S100 and an average value of on/off ratios of a plurality of TFTs prepared using a single-walled carbon nanotube ink.

FIG. 10 shows a relationship between the amount of Brij S100 contained in the used single-walled carbon nanotube ink and an average value of on/off ratios of the plurality of (about 30) prepared TFTs. When the amount of Brij S100 was 0.01 wt %, the on/off ratios indicated small values such as values of about double digit number or less, and when the amount of Brij S100 was 0.03 wt %, it is confirmed that a printed carbon nanotube TFT having an excellent on/off ratio was obtained.

Figure 11:
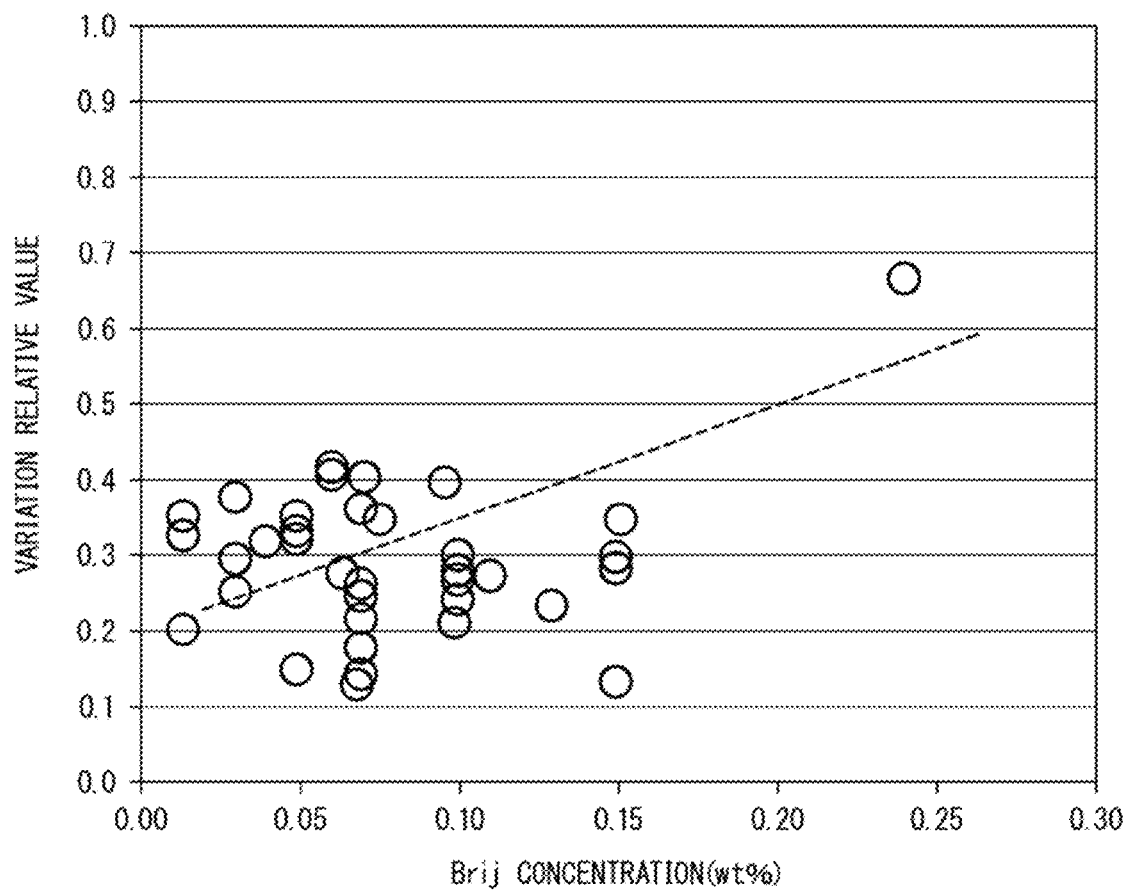
FIG. 11 is a diagram showing a relationship between the amount of Brij S100 and relative variation values of Ions of a plurality of TFTs in Experimental Example 1.

Also, FIG. 11 shows a relationship between the amount of Brij S100 contained in the used single-walled carbon nanotube ink and a relative variation value between Ions of the plurality of (about 30) prepared TFTs. It can be seen that, as the concentration of Brij S100 increases, the relative variation value between Ions tends to increase, and the uniformity of the prepared TFTs tends to decrease. In view of variation, it is confirmed that an excessive amount of Brij S100 tends to be undesirable, but if the amount of Brij S100 is 0.25 wt % or less, the relative variation value is 0.7 or less and TFTs which are adequate for use can be obtained. Furthermore, if the amount of Brij S100 is 0.15 wt % or less, a relative variation value is 0.5 or less and TFTs having particularly excellent uniformity is obtained.

As described above, in the case of a single-walled carbon nanotube ink, in a single-walled carbon nanotube ink containing a single-walled carbon nanotube having a concentration defined by the absorbance at a wavelength of 310 nm when the optical path length is 10 mm of 0.6 or more and 1.1 or less, if the amount of Brij S100 is 0.03 wt % or more, it can be confirmed that a printed carbon nanotube TFT having an excellent on/off ratio is obtained. Furthermore, if the amount of Brij S100 is 0.25 wt % or less, it is confirmed that a printed carbon nanotube TFT having satisfied uniformity as well is obtained. In addition, if the amount of Brij S100 is 0.15 wt % or less, it is confirmed that a printed carbon nanotube TFT having excellent uniformity is obtained.

An application requiring uniformity is an application in which many TFTs are integrated such as a two-dimensional array selection switch. Furthermore, since the uniformity can be corrected using a software method at the time of use, the priority required for the TFT characteristics with respect to the on/off ratio is higher.

Experimental Example 2

"Preparation of Single-Walled Carbon Nanotube Ink"

A dispersion liquid made of a single-walled carbon nanotube mixture was prepared in the same manner as in Experimental Example 1. Furthermore, for example, a semiconducting single-walled carbon nanotube having high purity was extracted from the dispersion liquid of the above-described single-walled carbon nanotube mixture using the method described in PCT International Publication No. WO 2010/150808 and the semiconducting single-walled carbon nanotube dispersion liquid was obtained.

Subsequently, a plurality of single-walled carbon nanotube inks were prepared by adjusting a concentration of the single-walled carbon nanotube and a concentration of Brij S100 in the above-described semiconducting single-walled carbon nanotube dispersion liquid.

In this experimental example, the concentration of the single-walled carbon nanotube was higher compared with that prepared in Experimental Example 1 and an absorbance at a wavelength of 310 nm when an optical path length was 10 mm was 1.4 or more and 1.6 or less. The amount of Brij S100 was 0.02 wt % or more and 0.5 wt % or less.

In the case of this experimental example, the purpose thereof was to investigate the influence of the concentration of the contained Brij S100 on the electrical characteristics of the prepared TFTs when the concentration of the single-walled carbon nanotube was higher than that of the single-walled carbon nanotube ink used in Experimental Example 1 and the absorbance at the wavelength of 310 nm when the optical path length was 10 mm was 1.4 or more and 1.6 or less.

"Preparation of Printed TFT"

A printed carbon nanotube TFT was provided on a plastic film using a plurality of single-walled carbon nanotube inks in the same manner as in Experimental Example 1.

"Evaluation of TFT Characteristics"

Transfer characteristics of the obtained TFTs were measured in the same manner as in Experimental Example 1.

Figure 12:
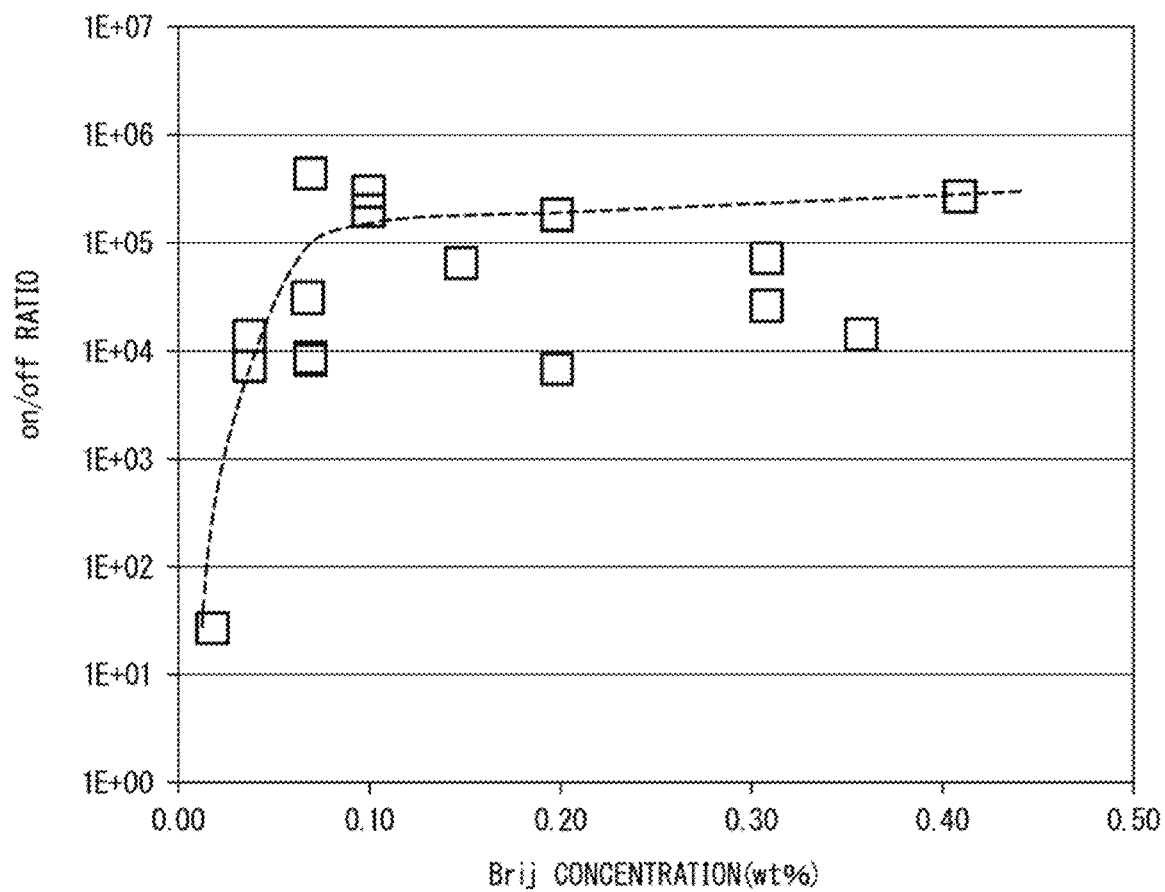
FIG. 12 is a diagram showing a relationship between the amount of Brij S100 and an average value of on/off ratios of a plurality of TFTs prepared using a single-walled carbon nanotube ink in Experimental Example 2.

FIG. 12 shows a relationship between the amount of Brij S100 contained in the used single-walled carbon nanotube ink and an average value of on/off ratios of the plurality of (about 30) prepared TFTs. When the amount of Brij S100 was 0.02 wt %, the on/off ratios indicated small values of about double digit number or less, and when the amount of Brij S100 was 0.04 wt %, it is confirmed that a printed carbon nanotube TFT having an excellent on/off ratio was obtained.

Figure 13:
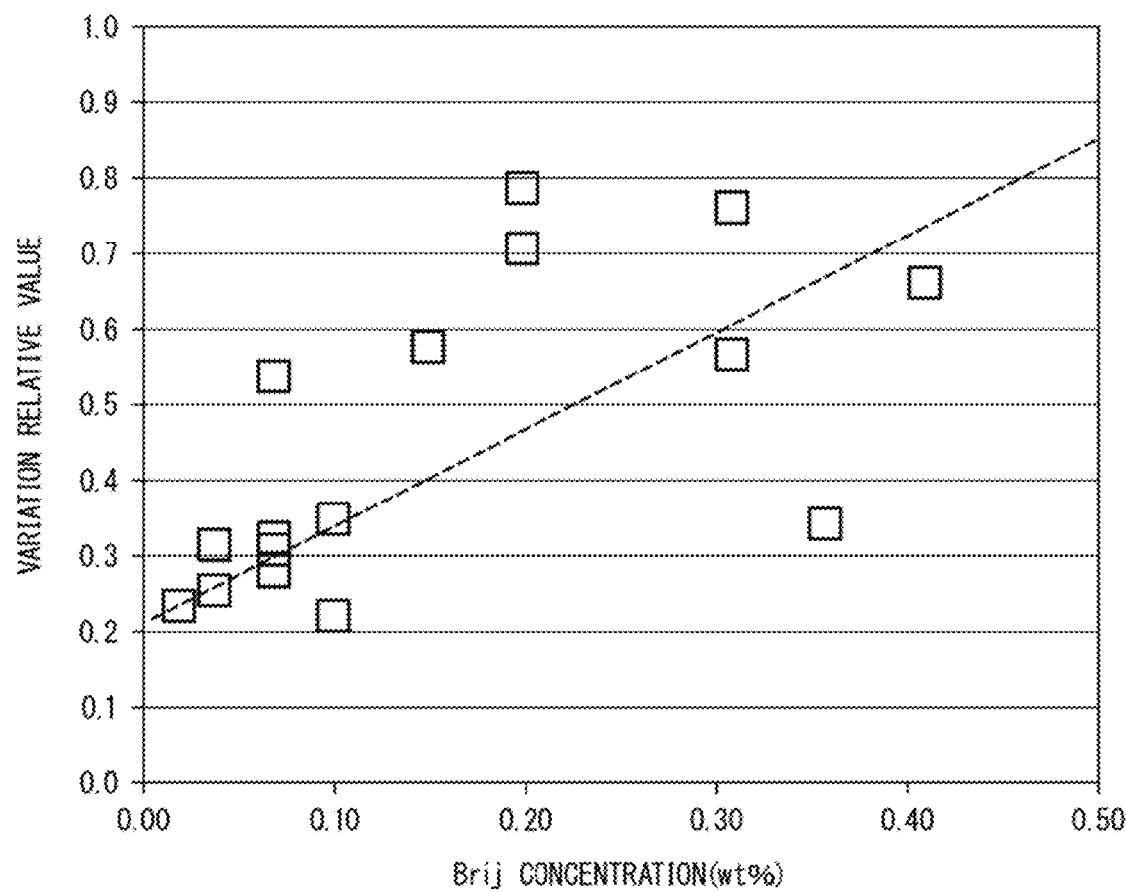
FIG. 13 is a diagram showing a relationship between the amount of Brij S100 and relative variation values of Ions of a plurality of TFTs in Experimental Example 2.

Also, FIG. 13 shows a relationship between the amount of Brij S100 contained in the used single-walled carbon nanotube ink and a relative variation value between Ions of the plurality of (about 30) prepared TFTs. It can be seen that the concentration of Brij S100 tends to increase, the relative variation value between Ions tends to increase, and the uniformity of the prepared TFTs tends to decrease, and these tendencies are shown in dotted lines in FIG. 13. In view of variation, it is confirmed that an excessive amount of Brij S100 tends to be undesirable, but if the amount of Brij S100 is 0.5 wt % or less, the relative variation value is 0.9 or less and TFTs which can be sufficiently used are obtained.

As described above, in the case of the single-walled carbon nanotube ink, in the single-walled carbon nanotube ink containing the single-walled carbon nanotube having the concentration defined by the absorbance at the wavelength of 310 nm when the optical path length is 10 mm of 1.4 or more and 1.6 or less, if the amount of Brij S100 is 0.04 wt % or more, it is confirmed that a printed carbon nanotube TFT having an excellent on/off ratio is obtained. Furthermore, if the amount of Brij S100 is 0.5 wt % or less, it is confirmed that a printed carbon nanotube TFT having satisfied uniformity is obtained. In addition, if the amount of Brij S100 is 0.15 wt % or less, it is confirmed that a printed carbon nanotube TFT having excellent uniformity is obtained.

The application requiring the uniformity is an application in which many TFTs are integrated such as a two-dimensional array selection switch. Furthermore, since the uniformity can be corrected using a software method at the time of use, the priority required for the TFT characteristics with respect to the on/off ratio is higher.

Figure 14:
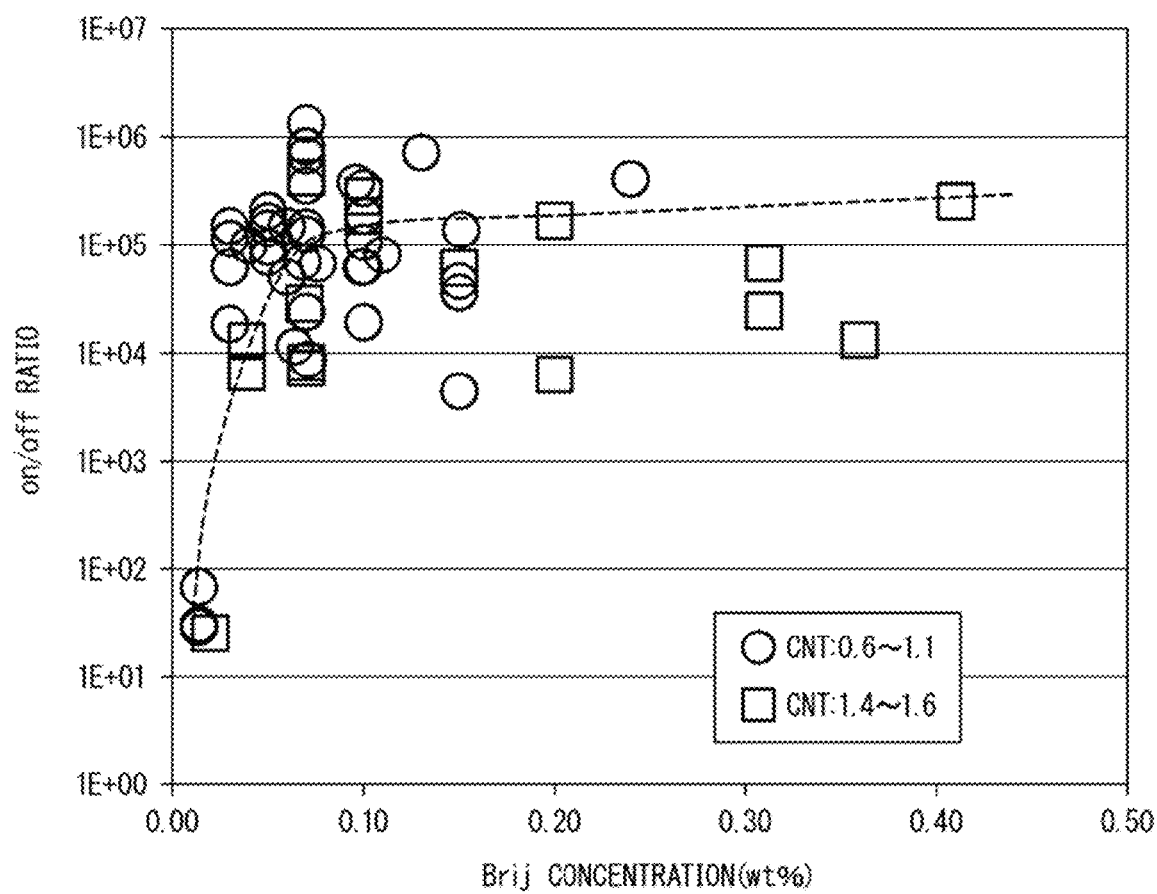
FIG. 14 is a diagram showing a relationship between the amount of Brij S100 and an average value of on/off ratios of a plurality of TFTs prepared using a single-walled carbon nanotube ink in Experimental Example 1 and Experimental Example 2.
Figure 15:
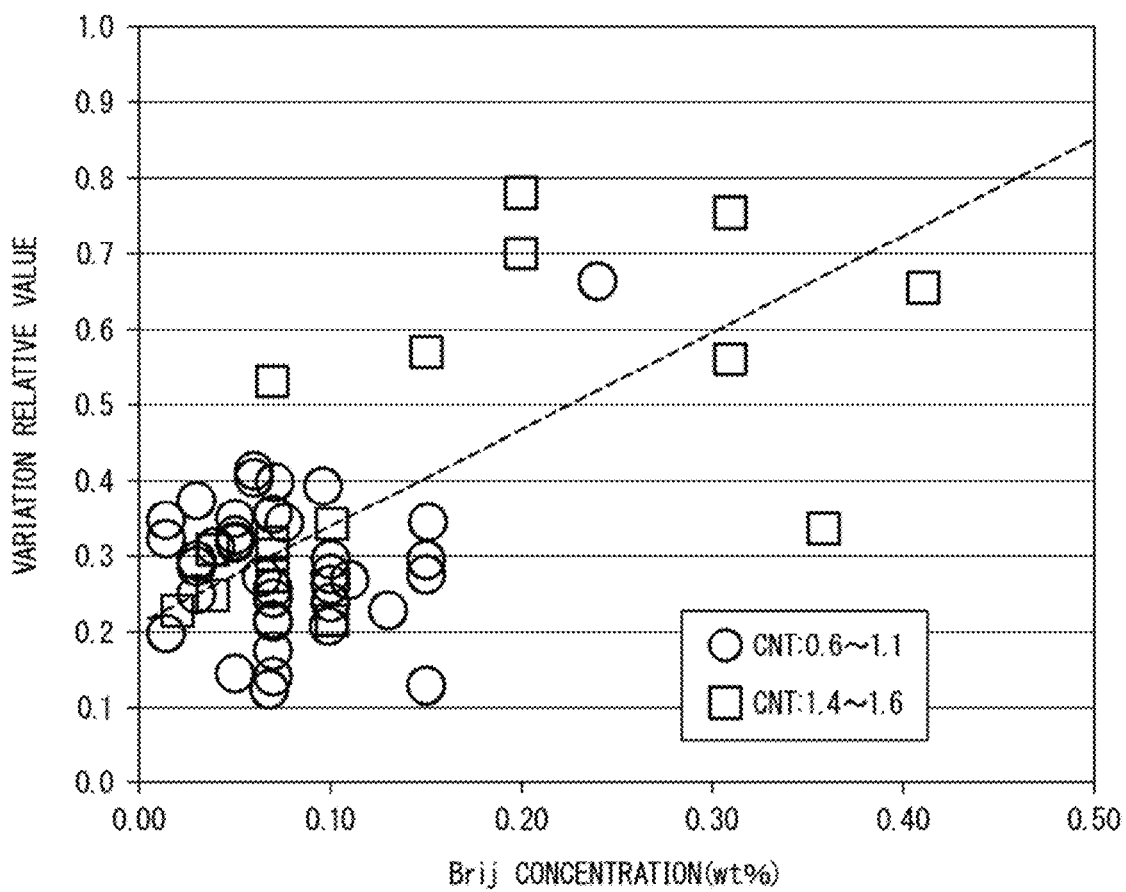
FIG. 15 is a diagram showing a relationship between the amount of Brij S100 and relative variation values of Ions of a plurality of TFTs in Experimental Example 1 and Experimental Example 2.

FIGS. 14 and 15 show the results of Experimental Example 1 and the results of Experimental Example 2 together. As described above, in the single-walled carbon nanotube ink of the present invention, the concentration of the contained single-walled carbon nanotube is defined by the absorbance at the wavelength of 310 nm when the optical path length is 10 mm. The characteristics of the printed carbon nanotube TFTs shown in FIGS. 14 and 15 are a summary of the characteristics of the TFTs provided using an ink having a wide concentration of single-walled carbon nanotubes such that the absorbance at the wavelength of 310 nm is 0.6 to 1.6. From the results shown in FIG. 14, in the ink of the wide concentration of the single-walled carbon nanotube, it is clear that, if the amount of Brij S100 is 0.03 wt % or more, a printed carbon nanotube TFT having an excellent on/off ratio is obtained. Furthermore, from the results shown in FIG. 15, in the ink of the wide concentration of the single-walled carbon nanotube, if the amount of Brij S100 is 0.5 wt % or less, it is confirmed that a relative variation value of the TFT is less than 1 and a printed carbon nanotube TFT having maintained uniformity is obtained. In addition, a printed carbon nanotube TFT having uniformity is obtained using the single-walled carbon nanotube ink in which the amount of Brij S100 is adjusted to 0.25 wt % or less. Moreover, in applications in which the uniformity is required, a printed carbon nanotube TFT having excellent uniformity is obtained by adjusting the amount of Brij S100 in the single-walled carbon nanotube ink to 0.15 wt % or less.

The application requiring the uniformity is an application in which many TFTs are integrated such as a two-dimensional array selection switch. Furthermore, since the uniformity can be corrected using a software method at the time of use, the priority required for the TFT characteristics with respect to the on/off ratio is higher.

Experimental Example 3

"Preparation of Single-Walled Carbon Nanotube Ink"

A dispersion liquid made of a single-walled carbon nanotube mixture was prepared in the same manner as in Experimental Example 1 and Experimental Example 2. Furthermore, for example, a semiconducting single-walled carbon nanotube having high purity was extracted from the dispersion liquid of the above-described single-walled carbon nanotube mixture using the method described in PCT International Publication No. WO 2010/150808 and the semiconducting single-walled carbon nanotube dispersion liquid was obtained.

Subsequently, a plurality of single-walled carbon nanotube inks were prepared by adjusting a concentration of the single-walled carbon nanotube and a concentration of Brij S100 in the above-described semiconducting single-walled carbon nanotube dispersion liquid.

In this experimental example, the amount of Brij S100 was 0.03 wt % or more and 0.15 wt % or less. Furthermore, an absorbance at a wavelength of 310 nm when an optical path length is 10 mm in which the concentration of the single-walled carbon nanotube was defined was 0.6 or more and 2.2 or less. Single-walled carbon nanotube ink having a wider concentration range of the single-walled carbon nanotube compared with Experimental Example 1 and Experimental Example 2 were prepared.

In the single-walled carbon nanotube inks of the present invention, the concentration of the single-walled carbon nanotube was defined by the absorbance at the wavelength of 310 nm when the optical path length was 10 mm. When a channel layer for a TFT is formed using a printing method, a concentration of a single-walled carbon nanotube in an ink to be used determined a density of the single-walled carbon nanotube in the channel layer to be formed. If the concentration of the single-walled carbon nanotube in the ink was low, a current path could not be secured and the prepared TFT could not exhibit sufficient performance. Furthermore, if the concentration of the single-walled carbon nanotube in the ink was high, the single-walled carbon nanotube was agglomerated inside the channel layer and the TFT characteristics was likely to deteriorate.

Also, it was clear from the results of Experimental Example 1 and Experimental Example 2 that a TFT having excellent uniformity was obtained when the amount of Brij S100 in the carbon nanotube ink was 0.03 wt % or more and 0.15 wt %. Therefore, in the case of this experimental example, in the single-walled carbon nanotube ink in which the amount of Brij S100 was 0.03 wt % or more and 0.15 wt %, the purpose thereof was to investigate the influence of the concentration of the single-walled carbon nanotube on the electrical characteristics of the printed TFT.

"Preparation of Printed TFT"

A printed carbon nanotube TFT was provided on a plastic film using a plurality of single-walled carbon nanotube inks in the same manner as in Experimental Example 1 and Experimental Example 2.

"Evaluation of TFT Characteristics"

Transfer characteristics of the obtained TFTs were measured in the same manner as in Experimental Example 1 and Experimental Example 2.

Figure 16:
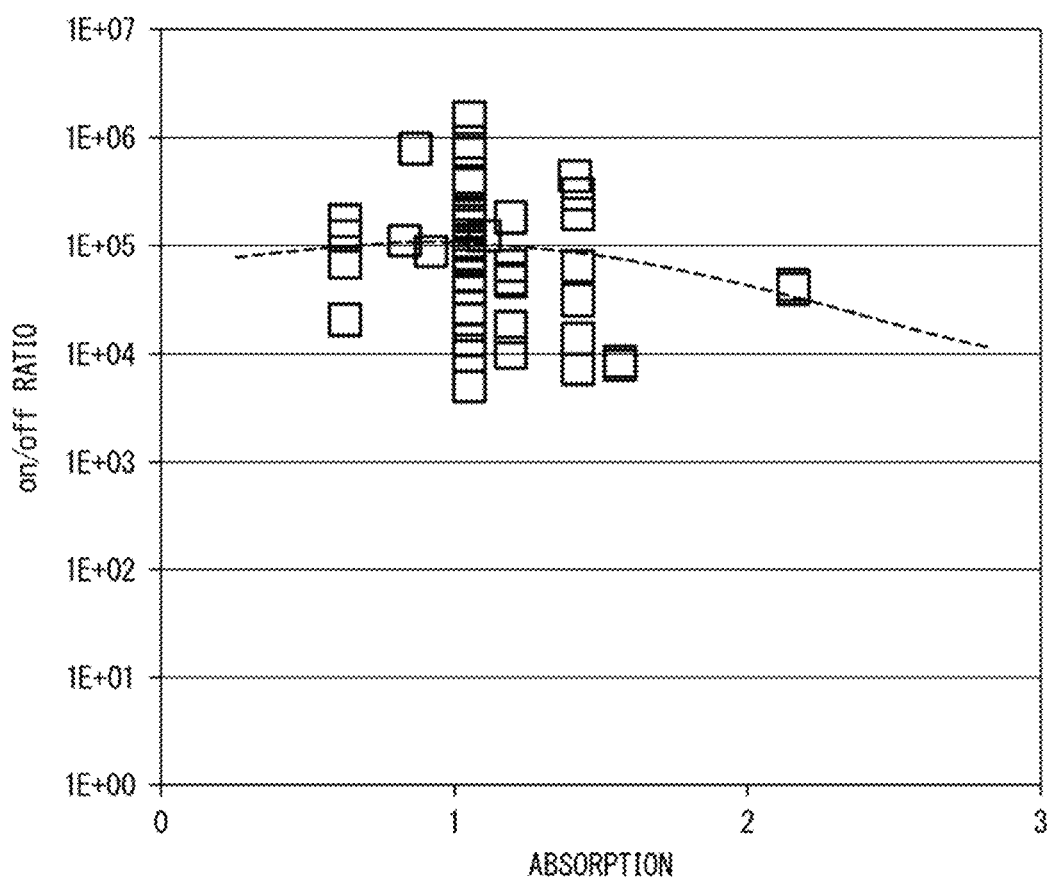
FIG. 16 is a diagram showing a relationship between an absorbance at a wavelength of 310 nm when an optical path length of a single-walled carbon nanotube ink is 10 mm and an average value of on/off ratios of a plurality of TFTs in Experimental Example 3.

FIG. 16 shows a relationship between an absorbance at a wavelength of 310 nm when an optical path length of the used single-walled carbon nanotube ink is 10 mm and an average value of on/off ratios of a plurality of (about 30) prepared TFTs.

It is confirmed from the results shown in FIG. 16 that, if an absorbance of the single-walled carbon nanotube ink is 0.6 or more and 2.2 or less, when a channel layer for a semiconductor device is formed using the single-walled carbon nanotube ink, the semiconductor device in which on/off ratios were substantially 10,000 or more is obtained.

Figure 17:
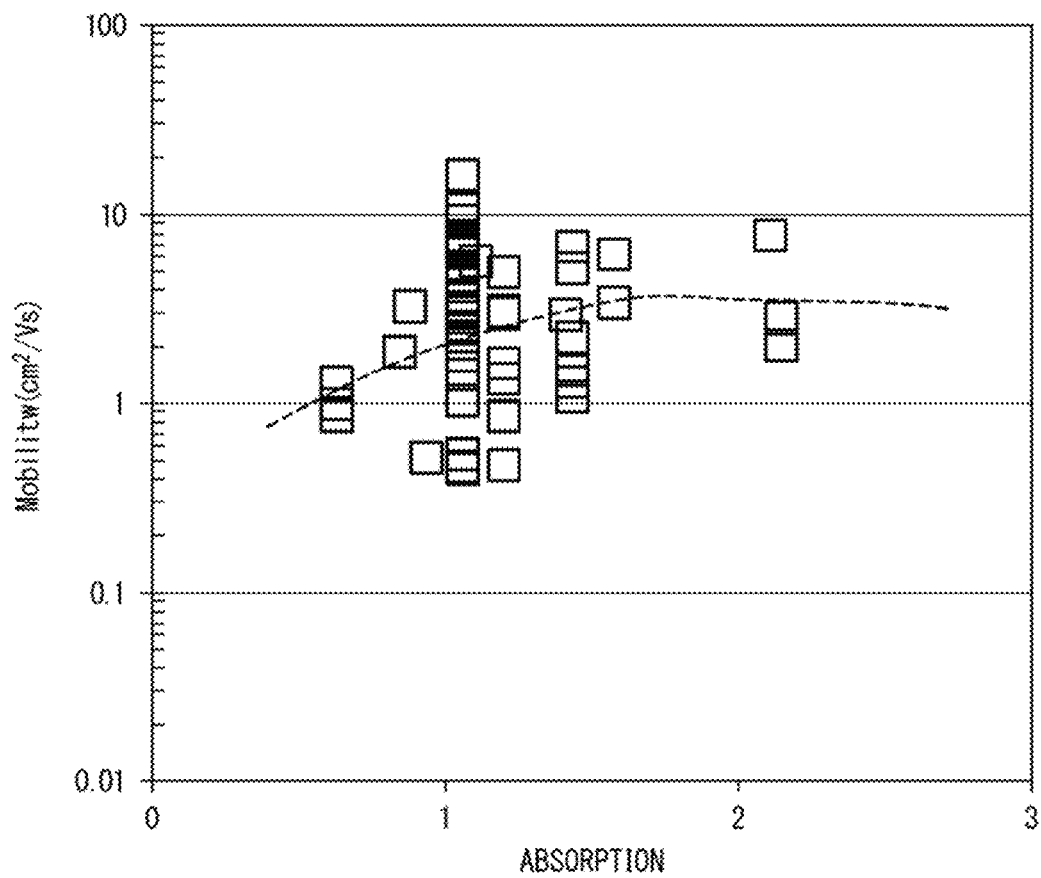
FIG. 17 is a diagram showing a relationship between an absorbance at a wavelength of 310 nm when an optical path length of a single-walled carbon nanotube ink is 10 mm and an average value of field effect mobility of a plurality of TFTs in Experimental Example 3.

FIG. 17 shows a relationship between an absorbance at a wavelength of 310 nm when an optical path length of the used single-walled carbon nanotube ink is 10 mm and an average value of field effect mobility of a plurality of (about 30) prepared TFTs.

It is confirmed from the results shown in FIG. 17 that, if the absorbance at the wavelength of 310 nm when the optical path length of the single-walled carbon nanotube ink is 10 mm was 0.6 or more, a field effect mobility of the prepared printed carbon nanotube TFT exceeds 1 $cm^2/Vs$. This indicates that this TFT has a more excellent field effect mobility than that of a TFT using a general coating type organic semiconductor.

Also, when an absorbance is 1.0 or less, it can be seen that the absorbance tends to decrease and the field effect mobility tends to decrease. These tendencies are shown in dotted lines in FIG. 17. These tendencies suggest that the single-walled carbon nanotube ink in which the absorbance is 0.2 or more has a field effect mobility of 0.5 $cm^2/Vs$ or more. This is a value comparable to that of a TFT in which a general amorphous silicon is used.

It can be found from the results shown in FIGS. 16 and 17 that, if a single-walled carbon nanotube ink in which an absorbance at a wavelength of 310 nm when an optical path length is 10 mm is 0.2 or more is used, a printed carbon nanotube comparable to that of a conventional TFT in which amorphous silicon is used for a channel layer is obtained.

Also, if the absorbance at the wavelength of 310 nm when the optical path length of the single-walled carbon nanotube ink is 10 mm is 0.6 or more, it is confirmed that the mobility of the prepared printed carbon nanotube TFT exceeds 1 $cm^2/Vs$.

Furthermore, if the single-walled carbon nanotube ink in which the absorbance at the wavelength of 310 nm when the optical path length is 10 mm is 0.6 or more and 2.2 or less is used, it is confirmed that a printed TFT having excellent on/off ratio and mobility is obtained.

Experimental Example 4

"Preparation of Single-Walled Carbon Nanotube Ink"

A dispersion liquid made of a single-walled carbon nanotube mixture was prepared in the same manner as in Experimental Example 1 and Experimental Example 2. Furthermore, for example, a semiconducting single-walled carbon nanotube having high purity was extracted from the dispersion liquid of the above-described single-walled carbon nanotube mixture using the method described in PCT International Publication No. WO 2010/150808 and the semiconducting single-walled carbon nanotube dispersion liquid was obtained.

Subsequently, a single-walled carbon nanotube ink was prepared by adjusting a concentration of the single-walled carbon nanotube and a concentration of Brij S100 in the above-described semiconducting single-walled carbon nanotube dispersion liquid.

In the single-walled carbon nanotube ink prepared in this experimental example, an absorbance at a wavelength of 310 nm when an optical path length is 10 mm was 1.06. Furthermore, the amount of Brij S100 was 0.1 wt %.

"Preparation of Printed TFT"

A 16×16 array of a printed carbon nanotube TFT was provided on a plastic film using a plurality of single-walled carbon nanotube inks in the same manner as in Experimental Example 1 and Experimental Example 2.

"Observation Using Atomic Force Microscope"

Figure 18:
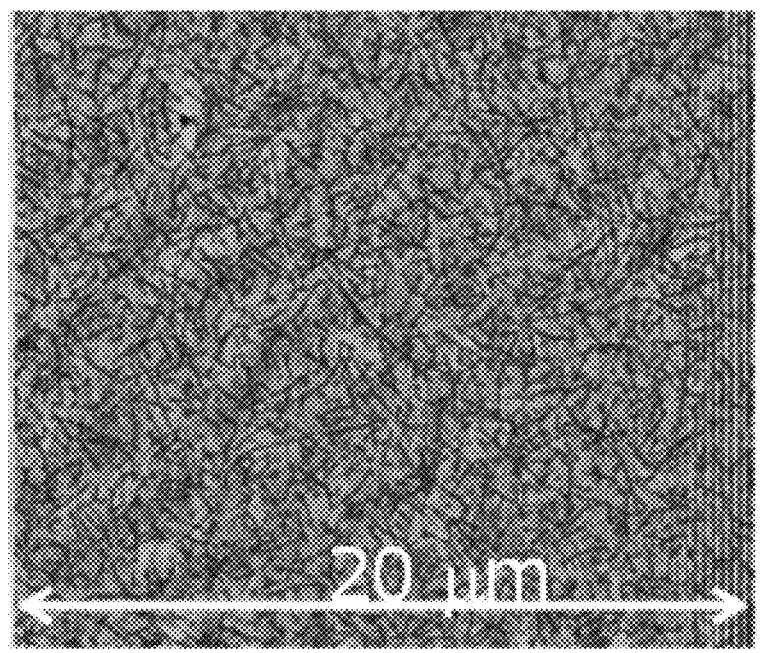
FIG. 18 is a diagram showing a phase image of a channel layer of a printed carbon nanotube TFT in Experimental Example 4.

A phase image of the channel layer for the obtained printed carbon nanotube TFT was obtained using an atomic force microscope (trade name: Dimension Icon; manufactured by Bruker). FIG. 18 shows the phase image of the channel layer for the printed carbon nanotube TFT.

As shown in FIG. 18, it is confirmed that, in the obtained printed carbon nanotube TFT, a uniform network of carbon nanotubes is formed.

"Evaluation of TFT Characteristics"

Transfer characteristics of the obtained TFT were measured in the same manner as in Experimental Example 1.

Figure 19:
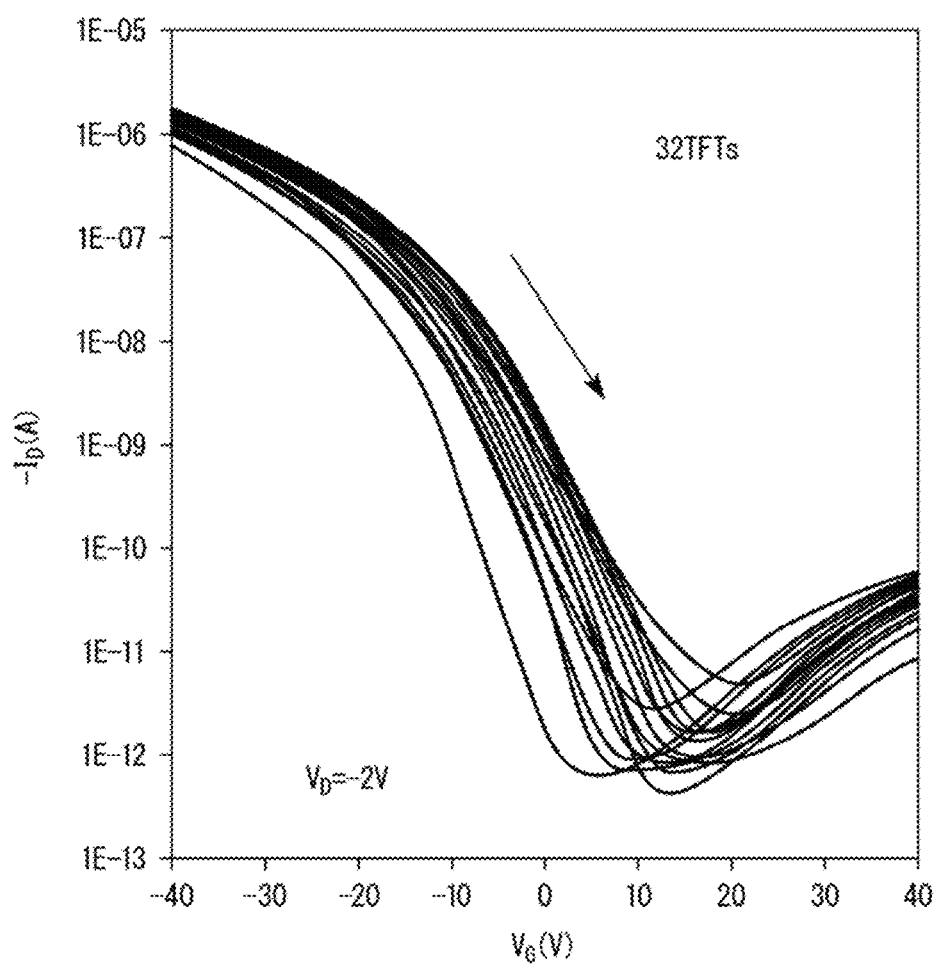
FIG. 19 is a diagram showing transfer characteristics of a TFT in Experimental Example 4.

FIG. 19 shows transfer characteristics of 32 printed carbon nanotube TFTs in the 16×16 array. It is confirmed from the obtained transfer characteristics that an average on/off ratio is about 1,000,000, average field effect mobility is 4.1 $cm^2/Vs$, and excellent transistor characteristics are provided.

Figure 20:
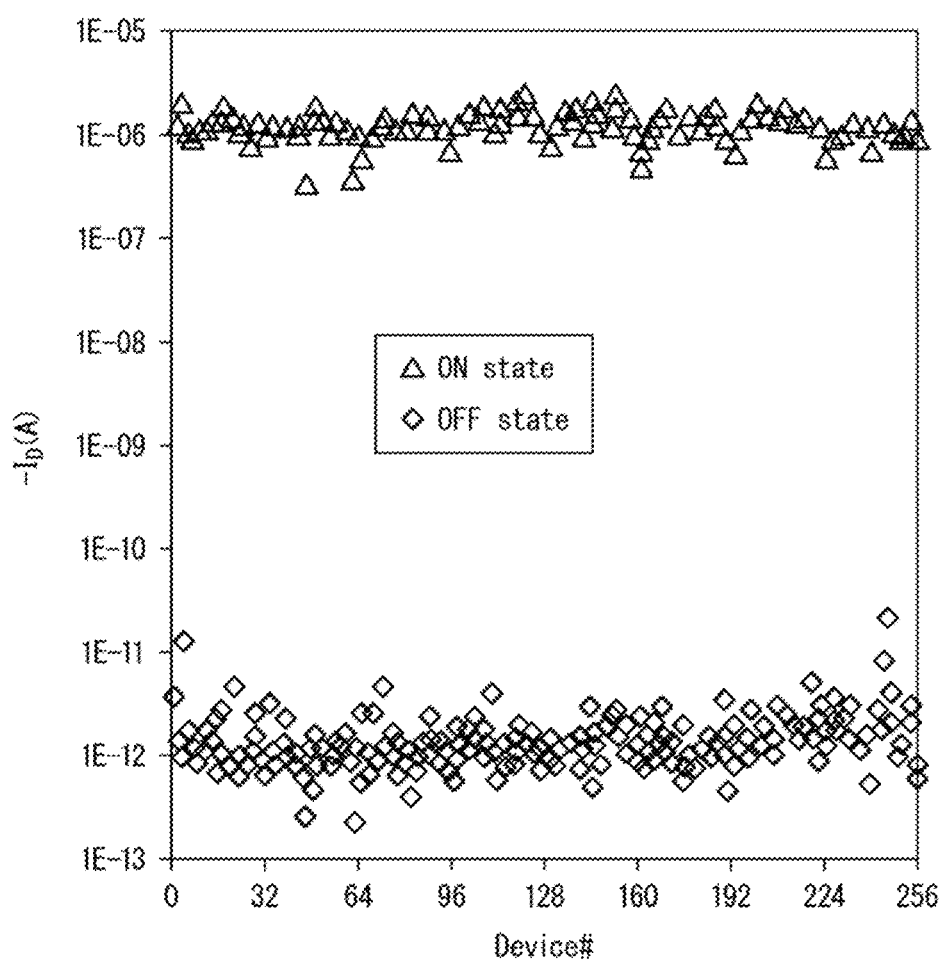
FIG. 20 is a diagram showing the evaluation results of current characteristics of a semiconductor device in Experimental Example 4.

FIG. 20 shows Ions and Ioffs of all 256 printed carbon nanotube TFTs in the 16×16 array. A relative variation value of this 16×16 array TFT is about 0.3 and excellent uniformity is obtained. Furthermore, it is confirmed that an on state and an off state of this 16×16 array TFT can be completely separated and the requirements as a selection transistor in the array is satisfied.

Experimental Example 5

Table 1 shows a zeta potential (a Z potential) and a critical micelle concentration (CMC; a molar concentration notation) obtained using the single-walled carbon nanotube ink and the aqueous Brij S100 solution of the present invention. Furthermore, the obtained zeta potentials and commonly known critical micelle concentrations of sodium dodecyl sulfate (SDS), sodium cholate (SC), and sodium dioxycholate (DOC) which are general anionic surfactants are shown together. When the zeta potentials were measured, aqueous surfactant solutions having concentrations higher than that of a CMC were prepared and the measurement was performed using a zeta potential measuring device (trade name: ELSZ-2Plus; manufactured by OTSUKA ELECTRONICS Co., LTD).

TABLE 1

| Material | Z potential (mV) | CMC (mM) |
| --- | --- | --- |
| CNT ink | −18.6 | — |
| Brij S100 | −15.4 | 0.02 |
| SDS | −62.8 | 8.2 |
| SC | −39.3 | 14 |
| DOC | −72.4 | 5 |

In the method for manufacturing the printed TFT described in the working examples of the present invention, a surface of a thin silica film formed on a surface on which a single-walled carbon nanotube ink is printed is treated with 3-aminopropyltriethoxysilane and modified with an amino group. Generally, an amino group is positively charged. Therefore, in single-walled carbon nanotube ink droplets applied onto a substrate, single-walled carbon nanotube ink micelles having a negative zeta potential are attracted to the surface of the substrate modified with the amino group. At this time, an excessive surfactant may be a factor in which a single-walled carbon nanotube is prevented from adsorbing to the surface of the substrate. It can be found that a zeta potential of Brij S100 is smaller than that of the single-walled carbon nanotube ink and that Brij S100 has a CMC as small as 0.02 mM and can extremely reduce a molecular concentration of an excessive surfactant while maintaining stable dispersion liquid. For this reason, in the single-walled carbon nanotube ink of the present invention, it can be thought that the single-walled carbon nanotube ink efficiently adsorbs to the surface of the substrate and good TFT characteristics are obtained. From this result, it can be though that it is desirable that the zeta potential of the micelles which hold the single-walled carbon nanotube be negatively larger than the zeta potential of the aqueous surfactant solution contained in the ink.

On the other hand, sodium dodecyl sulfate (SDS), sodium cholate (SC), and sodium dioxycholate (DOC) which are general anionic surfactants have a very large negative zeta potential and have a CMC which is 200 times or more that of Brij-S100. Therefore, in order to stably disperse the single-walled carbon nanotube using these surfactants, a large amount of excess surfactant molecules is required. These excess surfactant molecules having a large negative charge more easily move and more numerous because they are smaller than the micelles which hold the single-walled carbon nanotube. As a result, a large amount of surfactant molecules, which are necessary for stable dispersion liquid, covers the surface of the substrate modified with the amino group, thereby inhibiting the adsorption of the single-walled carbon nanotube on the surface of the substrate.

Single-walled carbon nanotubes can be separated (semi-metal-separated) into semiconducting single-walled carbon nanotubes and metallic single-walled carbon nanotubes using a density gradient centrifugation (DGU) method. In this case, generally, the single-walled carbon nanotubes can be used together with an anionic surfactant such as SDS, SC, and DOC as a surfactant.

Figure 21:
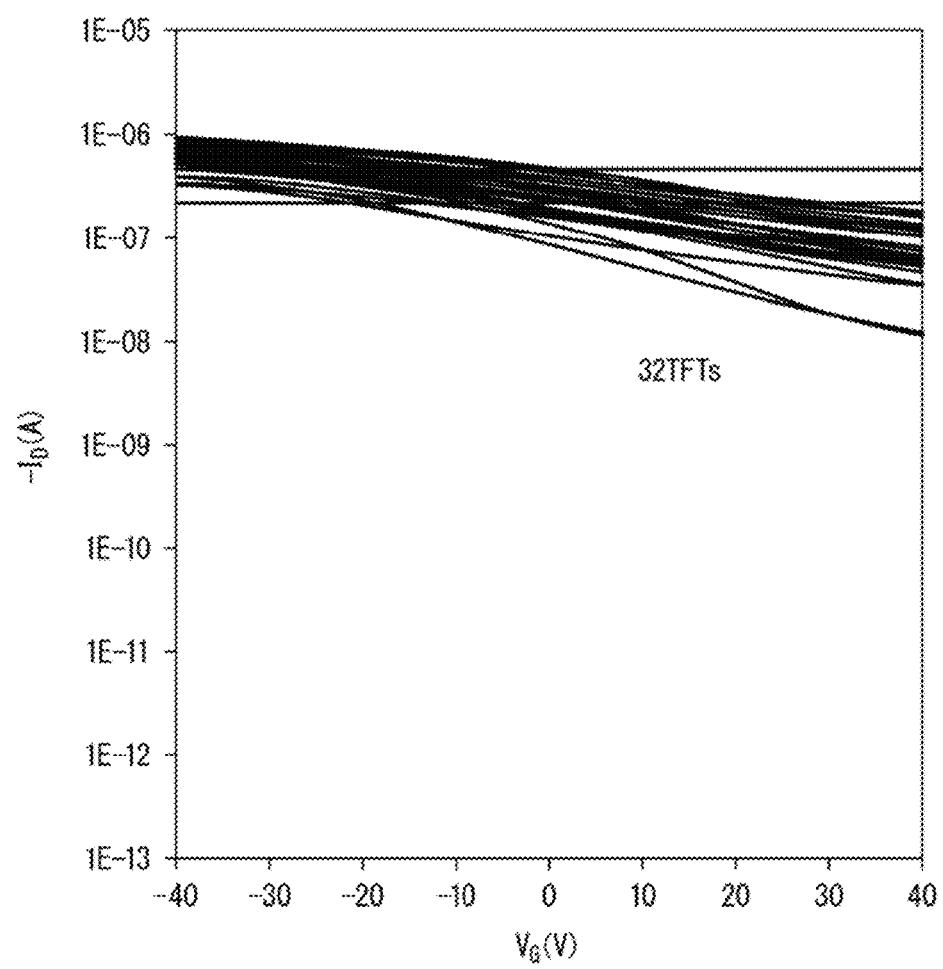
FIG. 21 is a diagram showing the evaluation results of current characteristics of a semiconductor device in Experimental Example 5.

A printed TFT was prepared using the extracted semiconducting single-walled carbon nanotubes using the DGU method. In the case of the used single-walled carbon nanotube ink, the concentration of the single-walled carbon nanotube was adjusted so that the absorbance at the wavelength of 310 nm when the optical path length is 10 mm is 0.51. FIG. 21 shows transfer characteristics of a plurality of prepared printed TFTs. It can be found that on/off ratios of all of the printed TFTs indicate values of about single digit number, which is very low compared with when the single-walled carbon nanotube ink of the present invention is used (FIGS. 9 and 19). This decrease in the on/off ratio indicates that the anionic surfactant inhibits the single-walled carbon nanotube from adsorbing to the surface of the substrate, resulting in deterioration of characteristics.

As described above, it can be shown, by using the polyoxyethylene alkyl ether as a surfactant for the single-walled carbon nanotube ink, very excellent characteristics is provided. Since the polyoxyethylene alkyl ether has a small CMC, it is possible to maintain stable dispersion liquid of single-walled carbon nanotubes while minimizing the number of excess surfactant molecules. Furthermore, the zeta potential of excess surfactant molecules is small (at a negative value) compared with micelles having semiconducting single-walled carbon tubes enclosed therein. Due to these characteristics, in the process for manufacturing the printed TFT, electrostatic adsorption of single-walled carbon nanotubes on the surface of the substrate is not easily inhibited by excess surfactant molecules. As a result, it is possible to provide a single-walled carbon nanotube ink having excellent coating properties during printing.

This application claims the priority on the basis of PCT International Application No. PCT/JP2017/035526 dated Sep. 29, 2017, the contents of which are incorporated herein by reference.

INDUSTRIAL APPLICABILITY

The nanocarbon ink of the present invention can be used for preparing a semiconductor device using a printing method.

REFERENCE SYMBOLS

100 Plastic film
110 Gate electrode
120 Insulating film
130 Silica film
140 Source electrode
150 Drain electrode
160 Channel layer forming region
170 Channel layer
200 Nano silver paste
210 Resin
220 Silsesquioxane
230 Coating film
240 Nanocarbon ink (single-walled carbon nanotube ink)

The invention claimed is:

1. A nanocarbon ink, comprising:
nanocarbons, a solvent, and a polyoxyethylene alkyl ether represented by the following expression:

$$C_nH_{2n}(OCH_2CH_2)_mOH$$

where, n=12 to 18 and m=20 to 100,
wherein the nanocarbons are single-walled carbon nanotubes, and
wherein an absorbance, which defines a concentration of the single-walled carbon nanotubes in the nanocarbon ink, at a wavelength of 310 nm when an optical path length is 10 mm is 0.2 or more.

2. The nanocarbon ink according to claim 1, wherein an amount of the polyoxyethylene alkyl ether is 0.03 wt % or more.

3. The nanocarbon ink according to claim 1, wherein an amount of the polyoxyethylene alkyl ether is 0.50 wt % or less.

4. The nanocarbon ink according to claim 1, wherein the absorbance at the wavelength of 310 nm when the optical path length is 10 mm is 0.6 or more.

5. The nanocarbon ink according to claim 1, wherein the absorbance at the wavelength of 310 nm when the optical path length is 10 mm is 2.2 or less.

6. The nanocarbon ink according to claim 1, wherein the solvent is either water, heavy water, or a mixture of water and heavy water.

7. The nanocarbon ink according to claim 1, wherein purity of semiconducting single-walled carbon nanotubes is 95% or more.

8. The nanocarbon ink according to claim 1, wherein a zeta potential of micelles which hold nanocarbons is negatively greater than a zeta potential of an aqueous surfactant solution contained in the ink.

9. A method for manufacturing a semiconductor device, comprising:
adhering the nanocarbon ink according to claim 1 to a channel layer forming region between a source electrode and a drain electrode to form a channel layer.

10. The nanocarbon ink according to claim 1, wherein an amount of the polyoxyethylene alkyl ether is 0.25 wt % or less.

11. The nanocarbon ink according to claim 1, wherein an amount of the polyoxyethylene alkyl ether is 0.15 wt % or less.

12. The nanocarbon ink according to claim 1, wherein an amount of the polyoxyethylene alkyl ether is 0.10 wt % or less.

* * * * *